United States Patent [19]

Genou

[11] Patent Number: 5,160,825

[45] Date of Patent: Nov. 3, 1992

[54] PROCESS AND DEVICE FOR SUPPLYING PROCESSING GAS TO A REACTOR LOCATED IN A ZONE SUBJECTED TO INTENSE ELECTRIC AND/OR ELECTROMAGNETIC FIELDS

[75] Inventor: Patrick Genou, Voisins le Bretonneaux, France

[73] Assignee: Eferel S.A., Neauphle le Chateau, France

[21] Appl. No.: 477,812

[22] PCT Filed: May 26, 1989

[86] PCT No.: PCT/FR89/00251

§ 371 Date: Feb. 20, 1990

§ 102(e) Date: Feb. 20, 1990

[87] PCT Pub. No.: WO89/12908

PCT Pub. Date: Dec. 28, 1989

[30] Foreign Application Priority Data

Jun. 21, 1988 [FR] France .................................. 88 08290

[51] Int. Cl.[5] .............................................. B23K 9/00
[52] U.S. Cl. ......................... 219/121.430; 219/121.36; 156/345; 373/18
[58] Field of Search ...................... 219/121.43, 121.44, 219/121.4, 121.52, 121.36, 75; 204/298.37, 10; 156/646, 345, 645; 373/18-22

[56] References Cited

U.S. PATENT DOCUMENTS 4,659,899  4/1987  Welkie et al. ................. 219/121.490

OTHER PUBLICATIONS

Nuclear Instruments and Methods in Physics Research, vol. B6, No. 1/2, 1-1985 Elsevie Science Publishers Division.

Primary Examiner—Mark H. Paschall
Attorney, Agent, or Firm—William A. Drucker

[57] ABSTRACT

The device described serves to supply processing gas to an ionic implanter isolated from its environment by an electrically conductive enclosure connected to earth. Said gases are supplied by intermediate containers arranged permanently inside the enclosure and periodically filled from gas sources arranged outside, via pipelines which are at least partly insulated and pass through the enclosure. Each phase of filling the containers which is effected during the periods when the implanter is stopped, is followed by a gas evacuation phase through said pipelines. The invention overcomes the problems relating to the replacement of gas cylinders arranged around the enclosure in conventional installations.

9 Claims, 1 Drawing Sheet

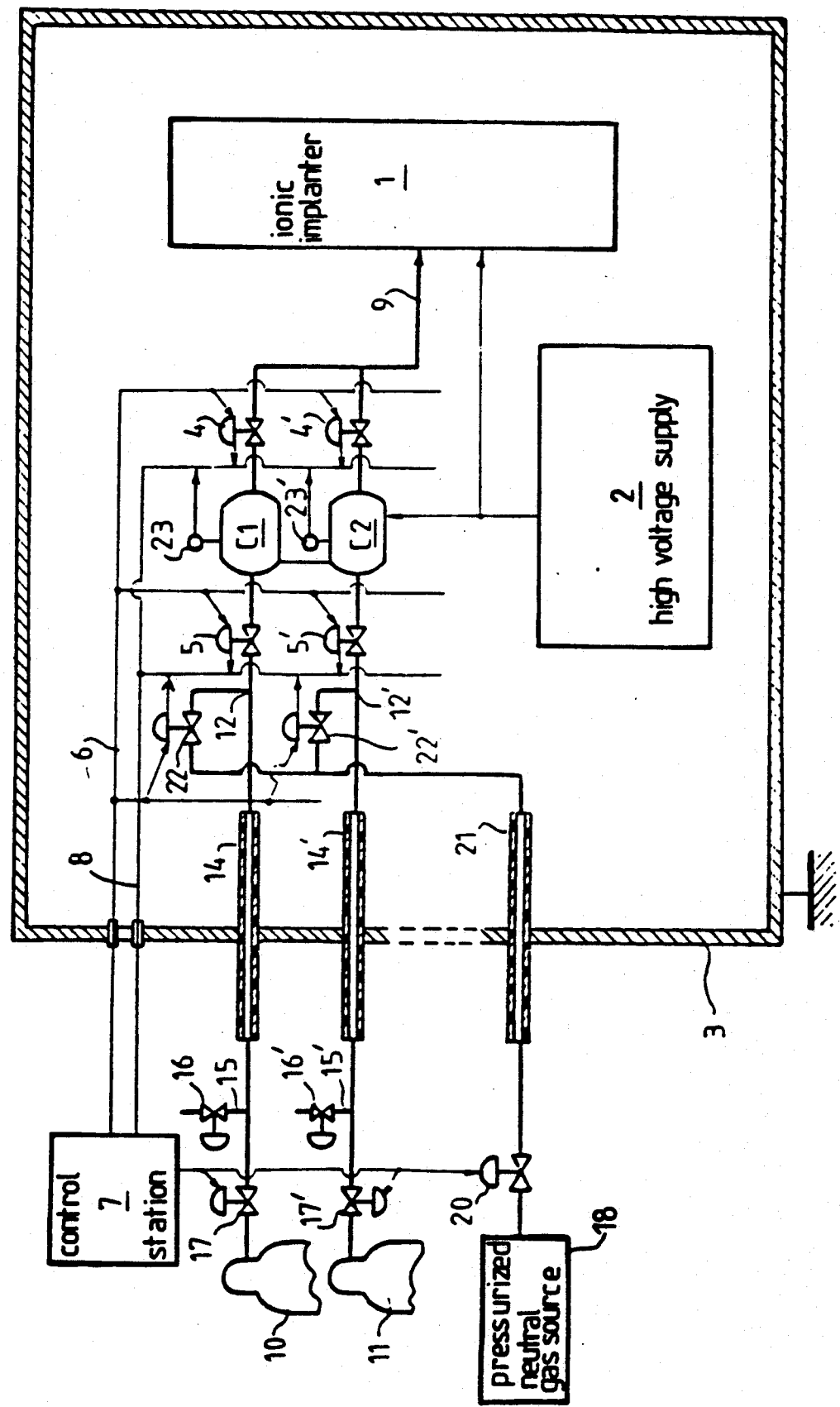

PROCESS AND DEVICE FOR SUPPLYING PROCESSING GAS TO A REACTOR LOCATED IN A ZONE SUBJECTED TO INTENSE ELECTRIC AND/OR ELECTROMAGNETIC FIELDS

BACKGROUND OF THE INVENTION

The invention relates to a process and device for supplying processing gas to a reactor located in a zone subjected to intense electric and/or electromagnetic fields likely to cause ionization of said gas.

It applies more particularly, but not exclusively, to supplying a processing device with processing gas by ionic bombardment, for example an ionic implanter of the type used in the semiconductor industry for incorporating ionized chemical species on silicon substrates for doping thereof.

In this example, the generation, acceleration and focussing of the ions bring into play considerable electric fields, requiring voltage sources of several tens of kilovolts.

This is why, for safety reasons, the reactor (or ionization chamber) in which the processing takes place is isolated, as well as the elements brought to said voltages situated in its environment, in a conducting enclosure serving as electric and/or electromagnetic screen which forms a potential barrier between its inner volume and its outer environment.

Because of the intensity of the intense electric fields present inside the enclosure, it is impossible during processing to admit the processing gases into the ionization chamber from gas sources situated outside the enclosure, particularly because of:

the impossibility of passing the metal pipelines through the enclosure (even in the case where these pipelines are sufficiently isolated with respect to the enclosure, these pipelines would be brought to high potentials and would form electric conducting bridges between the inner volume of the enclosure and its outer environment, the impossibility of causing the gases to flow through non conducting pipelines, because such gases would be ionized and would become conducting.

Considering these problems, the present solution consists in using processing gas reserves of small capacity (0.6 l in general) placed in a ventilated metal box, itself disposed inside the conducting enclosure and brought to the same potential as that of a high voltage source which supplies the reactor.

This solution has however several major drawbacks:

the need to frequently replace the cylinders, such replacement involving opening the conducting enclosure after interrupting the high voltage supply and after making sure that no residual electric charges remain inside the enclosure, these operations only being able to be carried out during a prolonged shut-down of the reactor;

handling difficulties due in particular to the compactness of the expansion panel associated with the gas sources and its position inside the enclosure, and a risk of contamination and corrosion of the equipment situated inside the enclosure during handling, such equipment being furthermore very expensive.

OBJECT AND SUMMARY OF THE INVENTION

The invention has then particularly as object to overcome all these drawbacks.

It proposes generally a process for supplying, with processing gas, a reactor operating by means of a high voltage current and situated in a zone subjected to intense electric and/or electromagnetic fields likely to cause ionization of said gas, said zone being insulated electrically from its outer environment by at least one electrically conducting wall forming a potential barrier.

According to the invention, this process is more particularly characterized in that it consists in supplying said reactor with gas by means of at least one intermediate capacity filled periodically from a gas source situated outside said zone, during interruptions of the high voltage current, by means of at least one pipeline passing through the wall, this pipeline being made from an electrically insulating material at least on its portion passing through said wall.

Furthermore, each phase of filling the intermediate capacity will be followed by closure of said pipeline in a portion situated in said zone, and evacuation of said gas at least in a portion of said pipeline passing through said wall.

Advantageously, such removal will be carried out by scavenging said portion with a gas which is not ionizable by said fields.

Considering the complete electric insulation provided by the electrically insulating material portion of the pipeline and because of said evacuation of the processing gas, at least in this portion, the intermediate capacity may be advantageously brought to a high voltage, like the gas reserves used previously.

BRIEF DESCRIPTION OF THE DRAWINGS

Of course, the invention also relates to the devices for implementing the above defined process.

One embodiment of such a device will be described hereafter by way of non limitative example with reference to the accompanying drawings in which:

The single FIGURE is a schematic representation of a device for supplying, with processing gas, an installation capable of effecting ionic implantations on semiconductor wafers.

DETAILED DESCRIPTION OF THE PREFERRED EMBODIMENT

In this installation the ionic implanter 1 (shown schematically by a block) is enclosed with its high voltage supply 2 inside an enclosure 3 made from an electrically conducting material connected to earth.

This enclosure 3 therefore provides electric and electromagnetic insulation, by means of a potential barrier, between its inner volume and its outer environment.

The processing gas supply for the ionic implanter 1 is provided by a battery of intermediate capacities $C_1$, $C_2$ (only two of which have been shown) disposed permanently inside enclosure 3 and whose inlet and outlet pipes are equipped with remotely controllable valves 4, 5-4', 5', for example pneumatically controlled valves, whose control circuits 6 (for example the intake pipes and possibly compressed air outlet) made at least partially from electrically insulating materials, pass through the enclosure to reach a control station 7. In this FIGURE, such control circuits have been grouped together in a single bundle shown with fine lines. These controllable valves 4, 5-4', 5' are further equipped with sensors for detecting their state (open, closed), such sensors being connected to the control station, for example by optical fibre connections 8 which pass through the enclosure. Here, also for the sake of clarity, such connections have been grouped together in a single bundle shown with a fine line.

The output pipes from the intermediate capacities $C_1$, $C_2$ are connected downstream of valves 4, 4' to a common collector 9 connected to the processing gas intake pipe of the ionic implanter 1.

The input pipes of capacities $C_1$, $C_2$ are connected to processing gas cylinders 10, 11 located outside the enclosure 3 by intake circuits each comprising, upstream of valves 5, 5':

means 12, 12' for connecting a scavenging circuit whose purpose will be described hereafter, a duct section 14, 14' made from an electrically insulating material, situated in a zone of this circuit passing through enclosure 3, a vent orifice 15, 15' which can be closed by a controlled valve 16, 16', and a processing gas intake control valve 17, 17' located at the outlet of cylinder 10, 11 (this valve being possibly incorporated with the cylinder 10, 11).

In this example, the scavenging circuit comprises a pressurized neutral gas source 18, for example a compressed argon generator, situated outside enclosure 3 whose outlet pipe equipped with a valve 20 passes through enclosure 3 through an electrically insulating material section 21 for connection to the connection means 12, 12', by means of connecting pipes each equipped with a remotely controllable valve 22, 22'.

These valves 22, 22' are controlled by means of control circuits similar to those of valves 4, 5 - 4', 5' which pass through the enclosure for connection to the control station 7.

Similarly, the state of these valves may be detected and transmitted to the control station 7 by an optical fibre transmission system.

A similar transmission system may further be used for transmitting information relative to the pressure of the gases contained in the intermediate capacities $C_1$, $C_2$ and which comes from pressure sensors 23, 23' specially designed for this purpose.

To avoid electrostatic or electrodynamic phenomena due to the presence inside the enclosure of intense electric fields, the intermediate capacities $C_1$, $C_2$ are brought to the high voltage potential of supply 2.

In accordance with the process of the invention, the intermediate capacities $C_1$, $C_2$ are filled during interruptions of the high voltage generated by the supply 2, for example before start-up and/or the implantation phases carried out by the ionic implanter 1.

Each such filling involves previously the closure of valves 4, 4', of the vent valves 16, 16' and of the scavenging valves 22, 22' then opening of valves 5, 5' and 17, 17'.

The processing gas from cylinders 10, 11 is then injected into the intermediate capacities $C_1$, $C_2$ until the pressure therein reaches a pre-determined threshold. At that time the pressure sensors 23, 23' transmit to the control station 7 an end of filling signal. The latter then outputs a control signal for closing the valves 5, 5' and 17, 17', then triggers off the scavenging phase.

This scavenging phase is then obtained by opening valves 22, 22' and 20 and the vent valves 16, 16'.

Following such opening, the compressed argon generated by source 18 is injected into the intake circuits just upstream of valves 5, 5'. This compressed gas will flow in an opposite direction through the intake circuits and drive the processing gases through the vent orifice 15, 15'. Once this scavenging phase has been carried out, the control station will cause closure of valves 22, 22', 16, 16' and 20.

The high voltage may be re-established for carrying out an implantation phase, the processing gas then being admitted into the ionic implanter following opening of valves 4, 4'.

Because of the electrically insulating material sections and because the gas contained therein is not ionizable by the high voltage delivered by the generator, no transfer of electric energy can occur between the inner volume of the enclosure and its outer environment.

The safety of this device may be increased by providing a device for preventing opening of valves 17, 17' and 5, 5' and, consequently, any possibility of access of the processing gas to the sections 14, 14' during the periods of application of the high voltage.

I claim:

1. Process for supplying, with processing gas, a reactor operating by means of a high voltage current and situated in a zone subjected to intense electric and/or electromagnetic fields likely to cause ionization of said gas, said zone being insulated electrically from its outer environment by at least one electrically conducting wall forming a potential barrier, said process consisting in supplying said reactor with gas by means of at least one intermediate container filled periodically during filling phases from a gas source situated outside said zone, during interruptions of the high voltage current, by means of at least one pipeline passing through the wall, this pipeline being made from an electrically insulating material at least in a portion passing through said wall and in that each of said filling phases is followed by closure of said pipeline by closure means situated in said zone, and evacuation of said gas at least in said portion.

2. Process according to claim 1, wherein said evacuation is carried out by scavenging said portion with a gas which is not ionizable by said fields.

3. Process according to claim 1, wherein said reactor is an ionic implanter.

4. Device for supplying, with processing gas, a reactor operating by means of a high voltage current and situated in a zone subjected to intense electric and/or electromagnetic fields likely to cause ionization of said gas, said zone being insulated electrically from its outer environment by at least one electrically conducting wall forming a potential barrier, said device further comprising at least one intermediate container disposed permanently inside said zone, said container having an output connected to a processing gas intake pipe of the reactor through a pipeline equipped with a first valve which can be controlled from the outside and an input, connected to a processing gas source situated outside through an intake pipe comprising, in said zone, a second valve which can be controlled from outside, a section made from an electrically insulating material which extends through at least the portion of the circuit passing through said wall and, in its part external to said zone, a vent orifice equipped with a controllable closure means then a valve controlling the intake of the processing gas, said device further comprising a scavenging circuit having, outside said zone, a source of gas which is not ionizable under the effect of said fields connected to the processing gas intake circuit at a position situated in said zone, upstream of the second valve through a scavenging pipe passing through said wall.

5. Device according to claim 4, wherein said scavenigng pipe comprises at least a third valve situated inside said zone and controllable from outside.

6. Device according to claim 4, wherein at least one section of the scavenging pipe passing through said wall is made from an electrically insulating material.

7. Device according to claim 4, wherein the state (open or closed) of said first, second and third valves is detected by respective sensors connected to a control station outside said zone by transmission lines passing through said wall.

8. Device according to claim 7, wherein said transmission lines are of optical fibre type.

9. Device according to claim 4, wherein said intermediate container is equipped with pressure sensors adapted for transmitting an end of filling signal to a control station situated outside said zone.

* * * * *